United States Patent
Li et al.

(10) Patent No.: US 8,536,777 B2
(45) Date of Patent: Sep. 17, 2013

(54) OXYCARBIDONITRIDE BASED PHOSPHORS AND LED LIGHTING DEVICES

(75) Inventors: Yuan Qiang Li, Plainsboro, NJ (US); Michael D. Romanelli, North Plainfield, NJ (US); Yongchi Tian, Princeton Junction, NJ (US)

(73) Assignee: Lightscape Materials, Inc., Princeton, NJ (US)

( * ) Notice: Subject to any disclaimer, the term of this patent is extended or adjusted under 35 U.S.C. 154(b) by 0 days.

(21) Appl. No.: 13/597,739

(22) Filed: Aug. 29, 2012

(65) Prior Publication Data

US 2013/0207537 A1 Aug. 15, 2013

Related U.S. Application Data (60) Provisional application No. 61/577,534, filed on Dec. 19, 2011.

(51) Int. Cl.
*H01J 1/63* (2006.01)
*C09K 11/79* (2006.01)
*C09K 11/65* (2006.01)

(52) U.S. Cl.
USPC ............... 313/503; 252/301.4 F; 252/301.6 F (58) Field of Classification Search
CPC .......... H01J 1/63; C09K 11/79; C09K 11/65; C01B 21/828
USPC .................... 313/503–512, 500; 445/24–25; 257/98–99, 40; 362/249.01
See application file for complete search history.

(56) References Cited

U.S. PATENT DOCUMENTS

| | | |
|---|---|---|
| 7,138,756 B2 | 11/2006 | Gotoh et al. |
| 7,252,788 B2 | 8/2007 | Nagatomi et al. |
| 7,258,816 B2 | 8/2007 | Tamaki et al. |
| 7,273,568 B2 | 9/2007 | Nagatomi et al. |
| 7,902,564 B2 | 3/2011 | Mueller-Mach et al. |
| 7,964,113 B2 | 6/2011 | Tamaki et al. |
| 8,007,683 B2 | 8/2011 | Starick et al. |
| 8,105,502 B2 | 1/2012 | Fukuda et al. |
| 8,119,028 B2 | 2/2012 | Le Toquin |
| 8,148,887 B2 | 4/2012 | Hirosaki et al. |
| 8,159,126 B2 | 4/2012 | Schmidt et al. |
| 8,206,611 B2 | 6/2012 | Hirosaki et al. |
| 2007/0007494 A1 | 1/2007 | Hirosaki et al. |
| 2009/0283721 A1 | 11/2009 | Liu et al. |
| 2010/0213489 A1 | 8/2010 | Kim et al. |
| 2010/0288972 A1 | 11/2010 | Roesler et al. |
| 2011/0204769 A1 | 8/2011 | Fukuda et al. |
| 2011/0279016 A1* | 11/2011 | Li et al. .................... 313/503 |
| 2011/0279017 A1* | 11/2011 | Li et al. .................... 313/503 |
| 2012/0062105 A1* | 3/2012 | Li et al. .................... 313/503 |
| 2012/0212122 A1* | 8/2012 | Thomas et al. ............ 313/498 |

OTHER PUBLICATIONS

Copending U.S. Appl. No. 13/557,613.
Copending U.S. Appl. No. 13/548,492.
Copending U.S. Appl. No. 13/597,633.
Copending U.S. Appl. No. 13/601,489.

* cited by examiner

*Primary Examiner* — Tracie Y Green
(74) *Attorney, Agent, or Firm* — Thomas S. Diebert (57) ABSTRACT

A red phosphor is provided. Also provided is a lighting apparatus containing a red phosphor.

10 Claims, 6 Drawing Sheets

OXYCARBIDONITRIDE BASED PHOSPHORS AND LED LIGHTING DEVICES

This application claims priority to U.S. Provisional Application No. 61/577,534 filed on Dec. 19, 2011; which provisional application is hereby incorporated by reference as if fully set forth herein.

This invention was made with United States Government support under Department of Energy grant number DE-EE0003245. The United States Government may have certain rights in this invention.

The present invention relates to a red phosphor and its use in lighting applications, particularly in light emitting diode lighting devices.

Phosphor-converted LEDs (pcLEDs) utilize a blue LED chip as a light source and one or more phosphors to produce white light. Devices based on pcLED technology are poised to become fundamental devices for general use in solid state lighting applications. Nevertheless, significant advances are required in order to achieve the performance specifications set by the solid state lighting market.

The pcLED devices create their white light emissions from a single LED by exciting the included phosphor(s) using the emission spectrum produced by the blue LED chip. The emission spectrum produced by the blue LED chip excites the included phosphor(s) which then produce an emission spectrum that combines with that of the blue LED chip to yield white light. It is important to recognize that color tuning of the blue LED chip and the included phosphor(s) is critical for the effectiveness and optimization of the pcLED devices. Accordingly, there is a continuing need for phosphor development to provide pcLED device manufactures with enhanced color tuning capabilities.

Also, the phosphors used in conventional pcLED device designs are located in close proximity to the blue LED light source. As a result, during light generation these phosphors are subjected to elevated temperatures. The junction temperatures exhibited by high power LED chips are typically in the range of 100 to 150° C. At such elevated temperatures, the crystal of the phosphors are at a high vibrationally excited state. When placed in such a high vibrationally excited state, the excitation energy can result in the generation of additional heat through non-luminescent relaxation rather than resulting in the desired luminescence emission from the phosphor. This heat generation exacerbates the situation resulting in a vicious cycle that contributes to the inability of current pcLED devices to achieve the industry established performance specifications for the solid state lighting market. Accordingly, successful development of pcLED devices for general illumination requires the identification of phosphors that can operate highly efficiently at temperatures of 100 to 150° C.

Nitride based phosphors have been proposed for use in pcLED devices because of their excellent luminescence performance at the high temperatures developed in pcLED devices. Examples of such nitride based phosphors include metal silicon nitride based phosphors. The host crystals of these phosphor materials consist mainly of chemical bonds of Si—N, Al—N, as well as hybrid bonds thereof, as the backbone of the structure. While these bonds are stable, the chemical bond between silicon and carbon (Si—C) has a higher bond energy, and therefore higher thermal and chemical stability. Furthermore, carbon forms very stable chemical bond with many metal atoms.

The introduction of carbon or carbide into crystalline phosphor materials, however, has previously been considered detrimental in luminescence performance. The often dark body color of various metal carbides can be a source of absorption or quenching of emission light. Also, residual unreacted carbon or carbide that remains in a particular phosphor preparation utilizing carbon or carbide as a precursor can reduce the emission intensity of the phosphor.

Carbidonitride phosphors can be comprised of carbon, silicon, germanium, nitrogen, aluminum, boron and other elements in the host crystal and one or more dopants as a luminescent activator. This class of phosphors has recently emerged as a color converter capable of converting near UV (nUV) or blue light to other light in the visible spectral range, e.g., blue, green, yellow, orange and red light. The host crystal of carbidonitride phosphors can be comprised of —N—Si—C—, —N—Si—N—, and/or —C—Si—C— networks in which the strong covalent bonds of Si—C and Si—N serve as the main building blocks of the structure. Generically, the network structure formed by Si—C bonds has a strong absorption in the entire visible light spectral region, and therefore has been previously considered unsuitable for use in host materials for high efficiency phosphors.

In certain carbidonitride phosphors, the carbon can enhance, rather than quench, the luminescence of the phosphor, in particular when the phosphor is subjected to relatively high temperatures (e.g. 200° C. to 400° C.). The reflectance of certain silicon carbidonitride phosphors in the wavelength range of the desired emission spectrum increases as the amount of carbon increases. These carbidonitride phosphors have been reported to exhibit excellent thermal stability of emission and high emission efficiency.

One family of carbidonitride based phosphors designed for use in pcLED devices is disclosed in United States Patent Application Publication No. 2011/0279016 to Li et al. Li et al. describe stoichiometric carbidonitride phosphors and light emitting devices which utilize the same, wherein the family of carbidonitride based phosphors are expressed as follows:

$$Ca_{1-x}Al_{x-xy}Si_{1-x+xy}N_{2-x-xy}C_{xy}:A \quad (1);$$

$$Ca_{1-x-z}Na_zM(III)_{x-xy-z}Si_{1-x+xy+z}N_{2-x-xy}C_{xy}:A \quad (2);$$

$$M(II)_{1-x-z}M(I)_zM(III)_{x-xy-z}Si_{1-x+xy+z}N_{2-x-xy}C_{xy}:A \quad (3);$$

$$M(II)_{1-x-z}M(I)_zM(III)_{x-xy-z}Si_{1-x+xy+z}N_{2-x-xy-2w/3}C_{xy}O_{w-v/2}H_v:A \quad (4); \text{ and}$$

$$M(II)_{1-x-z}M(I)_zM(III)_{x-xy-z}Si_{1-x+xy+z}N_{2-x-xy-2w/3-v/3}C_{xy}O_wH_v:A \quad (4a);$$

wherein $0<x<1$, $0<y<1$, $0\leq z<1$, $0\leq v<1$, $0<w<1$, $(x+z)<1$, $x>(xy+z)$, and $0<(x-xy-z)<1$; wherein M(II) is at least one divalent cation; wherein M(I) is at least one monovalent cation; M(III) is at least one trivalent cation; wherein H is at least one monovalent anion; and, wherein A is a luminescence activator doped in the crystal structure.

Notwithstanding, there is a continuing need for phosphors that provide pcLED device manufactures with enhanced color tuning capabilities. Particularly, there is a continuing need for additional red phosphor offerings that exhibit tunable emission spectra having a peak wavelength of 600 to 660 nm and that, preferably, further exhibit high efficiency at operating temperatures of 100 to 150° C.

The present invention provides a red phosphor, comprising: an inorganic compound represented by formula (1)

$$M(II)M(III)SiN_uC_xO_w:A \quad (1)$$

wherein M(II) is at least one divalent cation; wherein M(III) is at least one trivalent cation; wherein A is at least one luminescence activator; wherein $0<u<3$; wherein $0<x\leq 2$; wherein $0<w\leq 1.5$; wherein $0<(x+w)<3$; and, wherein $x\neq w$.

The present invention provides a red phosphor, comprising: an inorganic compound represented by formula (2)

wherein A is at least one luminescence activator; wherein $0 \leq a \leq 1$; wherein $0 \leq b \leq 1$; wherein $(a+b) \leq 1$; wherein $0 < u < 3$; wherein $0 < x \leq 2$; wherein $0 < w \leq 1.5$; wherein $0 < (x+w) < 3$; wherein $x \neq w$; and, wherein $0 < z \leq 0.5$.

The present invention provides a red phosphor, comprising: an inorganic compound represented by formula (2)

wherein $0 \leq a \leq 1$; wherein $0 \leq b \leq 1$; wherein $(a+b) \leq 1$; wherein $u=\{3-(4x/3)-(2w/3)\}$; wherein $0 < x \leq 2$; wherein $\{0.5*(3z/2)\} \leq w \leq \{1.5*(3z/2)\}$; wherein $0 < (x+w) < 3$; wherein $x \neq w$; and, wherein $0 < z \leq 0.5$.

The present invention provides a red phosphor, comprising: an inorganic compound represented by formula (2)

wherein $0 \leq a \leq 1$; wherein $0 \leq b \leq 1$; wherein $(a+b) \leq 1$; wherein $u=(3-x-w)$; wherein $0 < x \leq 2$; wherein $\{0.5*(3z/2)\} \leq w \leq \{1.5*(3z/2)\}$; wherein $0 < (x+w) < 3$; wherein $x \neq w$; and, wherein $0 < z \leq 0.5$.

The present invention provides a red phosphor, comprising: an inorganic compound represented by formula (2)

wherein A is at least one luminescence activator; wherein $0 \leq a \leq 1$; wherein $0 \leq b \leq 1$; wherein $(a+b) \leq 1$; wherein $u=\{3-(4x/3)-(2w/3)\}$; wherein $w=(3z/2)$; $0 < x \leq 2$; wherein $0 < (x+w) < 3$; wherein $x \neq w$; and, wherein $0 < z \leq 0.5$.

The present invention provides a lighting apparatus for emitting white light comprising: a light source, wherein the light source produces light having a source luminescence spectrum; and, a first source luminescence spectrum modifier, wherein the first source luminescence spectrum modifier is a red phosphor according to the present invention; wherein the red phosphor is radiationally coupled to the light source.

DETAILED DESCRIPTION

Preferably, the red phosphor of the present invention, comprises: an inorganic compound represented by formula (1)

wherein M(II) is at least one divalent cation (preferably, wherein M(II) is at least one divalent cation selected from the group consisting of Be, Mg, Ca, Sr, Ba, Cu, Co, Ni, Pd, Zn and Cd; more preferably, wherein M(II) is at least one divalent cation selected from the group consisting of Mg, Ca, Sr and Ba; most preferably, wherein M(II) is at least one divalent cation selected from the group consisting of Ca and Sr); wherein M(III) is at least one trivalent cation (preferably, wherein M(III) is at least one trivalent cation selected from the group consisting of B, Al, Ga, In, Sc and Y; more preferably, wherein M(III) is at least one trivalent cation selected from the group consisting of Al, Ga and B; most preferably, wherein M(III) is Al); wherein A is at least one luminescence activator (preferably, wherein A is at least one luminescence activator selected from the group of metal ions consisting of Ce, Pr, Nd, Sm, Eu, Gd, Tb, Dy, Ho, Er, Tm, Yb, Lu, Mn, Bi and Sb; more preferably, wherein A is at least one luminescence activator selected from the group of metal ions consisting of $Eu^{2+}$, $Ce^{3+}$, $Tb^{3+}$, $Yb^{2+}$ and $Mn^{2+}$; most preferably wherein A comprises $Eu^{2+}$); wherein $0 < u < 3$ (preferably, wherein $1 \leq u < 3$; more preferably, wherein $1 \leq u \leq 2.8$; most preferably, wherein $1.5 \leq u \leq 2.75$); wherein $0 < x \leq 2$ (preferably, wherein $0.05 < x \leq 1.75$; more preferably, wherein $0.1 \leq x \leq 1.5$; most preferably, wherein $0.2 \leq x \leq 1$); wherein $0 < w \leq 1.5$ (preferably, wherein $0 < w \leq 0.75$; more preferably, wherein $0 < w \leq 0.3$; still more preferably, wherein $0.001 < w \leq 0.075$; most preferably, wherein $0.001 < w \leq 0.015$); wherein $0 < (x+w) < 3$; and, wherein $x \neq w$.

Preferably, in the inorganic compound represented by formula (1), A is doped in the host crystal lattice in an amount equal to 0.0001 to 50% (more preferably, 0.001 to 20%; still more preferably 0.1 to 5%; most preferably 0.1 to 1%), relative to the M(II) content on a mol basis. Without wishing to be bound by theory, it is believed that the inorganic compounds represented by formula (1) are crystallized in an orthorhombic Cmc21 crystal system. Also, the luminescence activator, A, can be located in at least one of substitutional (e.g., replacing M(II) cations) and interstitial sites in the host crystal lattice.

The red phosphor of the present invention, preferably exhibits a luminescent emission in a wavelength range of 400 to 800 nm upon excitation with a higher radiation energy. More preferably, the red phosphor of the present invention exhibits an emission band in a wavelength range of 550 to 750 nm upon excitation with light energy having a wavelength of 200 to 550 nm. Preferably, the red phosphor exhibits an emission spectra having a peak emission wavelength, $P\lambda_{phosphor}$, of 600 to 660 nm (more preferably, 620 to 650 nm; still more preferably, 625 to 650 nm; most preferably, 625 to 640 nm) upon excitation from a light source exhibiting an emission spectra having a peak source wavelength, $P\lambda_{source}$, of 200 to 600 nm (preferably, 200 to 550 nm; more preferably, 350 to 490 nm; most preferably, wherein $P\lambda_{source}$ is 453 nm).

Preferably, the inorganic compound represented by formula (1) is represented by formula (2)

wherein A is at least one luminescence activator (preferably, wherein A is at least one luminescence activator selected from the group of metal ions consisting of Ce, Pr, Nd, Sm, Eu, Gd, Tb, Dy, Ho, Er, Tm, Yb, Lu, Mn, Bi and Sb; more preferably, wherein A is at least one luminescence activator selected from the group of metal ions consisting of $Eu^{2+}$, $Ce^{3+}$, $Tb^{3+}$, $Yb^{2+}$ and $Mn^{2+}$; most preferably, wherein A is $Eu^{2+}$); wherein $0 \leq a \leq 1$ (preferably, wherein $0.01 \leq a \leq 0.5$; more preferably, wherein $0.1 \leq a \leq 0.3$); wherein $0 \leq b \leq 1$ (preferably, wherein $0.5 \leq b \leq 0.99$; more preferably, wherein $0.7 \leq b \leq 0.9$); (a+b) $\leq 1$; wherein $0 < u < 3$ (preferably, wherein $1 \leq u < 3$; more preferably, $1 \leq u \leq 2.8$; most preferably, $1.5 \leq u \leq 2.75$); wherein $0 < x \leq 2$ (preferably, wherein $0.05 < x \leq 1.75$; more preferably, wherein $0.1 \leq x \leq 1.5$; most preferably, wherein $0.2 \leq x \leq 1$); wherein $0 < w \leq 1.5$ (preferably, wherein $0 < w \leq 0.75$; more preferably, wherein $0 < w \leq 0.3$; still more preferably, wherein $0.001 < w \leq 0.075$; most preferably, wherein $0.001 < w \leq 0.015$); wherein $0 < (x+w) < 3$; wherein $x \neq w$; and, wherein $0 < z \leq 0.5$ (preferably, wherein $0 < z \leq 0.2$; more preferably, wherein $0.001 < z \leq 0.05$; most preferably, wherein $0.001 < z \leq 0.01$).

Without wishing to be bound by theory, it is believed that the inorganic compounds represented by formula (2) are crystallized in an orthorhombic Cmc21 crystal system. Also, the luminescence activator, A, can be located in at least one of substitutional (e.g., replacing Ca or Sr cations) and interstitial sites in the host crystal lattice.

Preferably, the inorganic compound represented by formula (1) is represented by formula (2)

$(Ca_aSr_b)AlSiN_uC_xO_w:zEu^{2+}$ (2)

wherein $0 \leq a \leq 1$ (preferably, wherein $0.01 \leq a \leq 0.5$; more preferably, wherein $0.1 \leq a \leq 0.3$); wherein $0 \leq b \leq 1$ (preferably, wherein $0.5 \leq b \leq 0.99$; more preferably, wherein $0.7 \leq b \leq 0.9$); (a+b) $\leq 1$; wherein $u = \{3-(4x/3)-(2w/3)\}$; wherein $0 < x \leq 2$ (preferably, wherein $0.05 < x \leq 1.75$; more preferably, wherein $0.1 \leq x \leq 1.5$; most preferably, wherein $0.2 \leq x \leq 1$); wherein $\{0.5*(3z/2)\} \leq w \leq \{1.5*(3z/2)\}$ (preferably, wherein $\{0.9*(3z/2)\} \leq w \leq \{1.1*(3z/2)\}$; more preferably, wherein $\{0.95*(3z/2)\} \leq w \leq \{1.05*(3z/2)\}$; still more preferably, wherein $\{0.99*(3z/2)\} \leq w \leq \{1.01*(3z/2)\}$; most preferably, wherein $w = (3z/2)$); wherein $0 < (x+w) < 3$; wherein $x \neq w$; and, wherein $0 < z \leq 0.5$ (preferably, wherein $0 < z \leq 0.2$; more preferably, wherein $0.001 < z \leq 0.05$; most preferably, wherein $0.001 < z \leq 0.01$).

Preferably, the inorganic compound represented by formula (1) is represented by formula (2)

$(Ca_aSr_b)AlSiN_uC_xO_w:zEu^{2+}$ (2)

wherein $0 \leq a \leq 1$ (preferably, wherein $0.01 \leq a \leq 0.5$; more preferably, wherein $0.1 \leq a \leq 0.3$); wherein $0 \leq b \leq 1$ (preferably, wherein $0.5 \leq b \leq 0.99$; more preferably, wherein $0.7 \leq b \leq 0.9$); (a+b) $\leq 1$; wherein $u = (3-x-w)$; wherein $0 < x \leq 2$ (preferably, wherein $0.05 < x \leq 1.75$; more preferably, wherein $0.1 \leq x \leq 1.5$; most preferably, wherein $0.2 \leq x \leq 1$); wherein $\{0.5*(3z/2)\} \leq w \leq \{1.5*(3z/2)\}$ (preferably, wherein $\{0.9*(3z/2)\} \leq w \leq \{1.1*(3z/2)\}$; more preferably, wherein $\{0.95*(3z/2)\} \leq w \leq \{1.05*(3z/2)\}$; still more preferably, wherein $\{0.99*(3z/2)\} \leq w \leq \{1.01*(3z/2)\}$; most preferably, wherein $w = (3z/2)$); wherein $0 < (x+w) < 3$; wherein $x \neq w$; and, wherein $0 < z \leq 0.5$ (preferably, wherein $0 < z \leq 0.2$; more preferably, wherein $0.001 < z \leq 0.05$; most preferably, wherein $0.001 < z \leq 0.01$).

The red phosphor of the present invention can contain impurities. Preferably, the red phosphor of the present invention, comprises: $\geq 80$ wt % (more preferably, 80 to 100 wt %; still more preferably 90 to 100 wt %; yet still more preferably 95 to 100 wt %; most preferably 99 to 100 wt %) of the inorganic compound represented by formula (1). More preferably, the red phosphor of the present invention, comprises: $\geq 80$ wt % (more preferably, 80 to 100 wt %; still more preferably 90 to 100 wt %; yet still more preferably 95 to 100 wt %; most preferably 99 to 100 wt %) of the inorganic compound represented by formula (1); wherein the inorganic compound represented by formula (1) is represented by formula (2).

Preferably, the red phosphor of the present invention, comprises: an inorganic compound represented by formula (1) (preferably, represented by formula (2)), wherein the compound exhibits the ratio of atoms specified by formula (1) (preferably, by formula (2)), which ratio can be in stoichiometric proportions or in non-stoichiometric proportions. The inorganic compound represented by formula (1) (preferably, represented by formula (2)) can be present as at least two different crystalline phases. Preferably, the inorganic compound represented by formula (1) (preferably, represented by formula (2)) is present as one substantially pure crystalline phase (more preferably, $\geq 90\%$ of a particular crystalline phase; most preferably, $\geq 95\%$ of a particular crystalline phase).

Preferably, the red phosphor of the present invention maintains $\geq 70\%$ (more preferably, $\geq 85\%$; most preferably, $\geq 90\%$) of its relative emission intensity at temperatures of 25 to 150° C. More preferably, the red phosphor of the present invention maintains $\geq 70\%$ (more preferably, $\geq 85\%$; most preferably, $\geq 90\%$) of its relative emission intensity at temperatures of 25 to 200° C. Most preferably, the red phosphor of the present invention maintains $\geq 70\%$ (more preferably, $\geq 85\%$; most preferably, $\geq 90\%$) of its relative emission intensity at temperatures of 25 to 250° C.

Preferably, the red phosphor of the present invention exhibits a median diameter of 2 to 50 microns (more preferably, 4 to 30 microns; most preferably, 5 to 20 microns).

The red phosphor of the present invention, optionally, further comprises a surface treatment applied to a surface of the inorganic compound. Preferably, the surface treatment provides at least one of enhanced stability and enhanced processability. The surface treatment can provide enhanced stability to the inorganic compound represented by formula (1) (preferably, represented by formula (2)) by imparting the inorganic compound with, for example, improved moisture resistance. The surface treatment can provide enhanced processability to the inorganic compound represented by formula (1) (preferably, represented by formula (2)) by enhancing the dispersibility of the inorganic compound in a given liquid carrier. Surface treatments include, for example, polymers (e.g., acrylic resins, polycarbonates, polyamides, polyethylenes and polyorganosiloxanes); metal oxides (e.g., magnesium oxide, aluminum oxide, silicon dioxide, titanium oxide, zirconium oxide, tin oxide, germanium oxide, niobium oxide, tantalum oxide, vanadium oxide, boron oxide, antimony oxide, zinc oxide, yttrium oxide, bismuth oxide); metal nitrides (e.g., silicon nitride, aluminum nitride); orthophosphates (e.g., calcium phosphate, barium phosphate, strontium phosphate); polyphosphates; combinations of alkali metal phosphates and alkaline-Earth metal phosphates with calcium salts (e.g., sodium phosphate with calcium nitrate); and, glass materials (e.g., borosilicates, phospho silicates, alkali silicates).

The red phosphor of the present invention is, optionally, dispersed in a liquid carrier to form a phosphor composition of the present invention. Preferably, the phosphor composition of the present invention, comprises an inorganic compound represented by formula (1); and a liquid carrier, wherein the inorganic compound is dispersed in the liquid carrier. More preferably, the phosphor composition of the present invention, comprises an inorganic compound represented by formula (2); and a liquid carrier, wherein the inorganic compound is dispersed in the liquid carrier. The phosphor composition of the present invention is preferably formulated with a liquid carrier to facilitate at least one of: the storage of the inorganic compound represented by formula (1) (preferably, represented by formula (2)) and the manufacture of a lighting apparatus (preferably, a pcLED device). The liquid carrier can be selected to be a fugitive substance (e.g., to be evaporated during processing). The liquid carrier can be selected to be a transformative substance (e.g., to be reacted from a flowable liquid to a non-flowable material).

Fugitive substances suitable for use as liquid carriers include, for example: non-polar solvents (e.g., pentane; cyclopentane; hexane; cyclohexane; benzene; toluene; 1,4-dioxane; chloroform; diethyl ether) and polar aprotic solvents (e.g., dichloromethane; tetrahydrofuran; ethyl acetate; acetone; dimethylformamide; acetonitrile; dimethyl sulfoxide; propylene carbonate).

Transformative liquid carriers suitable for use as liquid carriers include, for example: thermoplastic resins and thermosetting resins that undergo curing upon exposure to at least one of thermal energy and photonic energy. For example, transformative liquid media include: acrylic resins (e.g., (alkyl)acrylates, such as, polymethyl (meth)acrylate); styrene; styrene-acrylonitrile copolymers; polycarbonates; polyesters; phenoxy resins; butyral resins; polyvinyl alcohols; cellulose resins (e.g., ethyl cellulose, cellulose acetate, and cellulose acetate butyrate); epoxy resins; phenol resins; and silicone resins (e.g., polyorganosiloxanes).

The phosphor composition of the present invention, optionally, further comprises: an additive. Preferred additives include a dispersant. Preferably, the dispersant promotes the formation and stabilization of the phosphor composition. Preferred dispersants include, for example, titanium oxides, aluminum oxides, barium titanates and silicon oxides.

The phosphor composition of the present invention is preferably prepared using a combination of source materials selected to provide the elements present in the phosphor composition. Some preferred raw material source materials are identified in TABLE 1 Some of these raw material components are preferably provided together as a single raw material compound. For example, the Si component and the N component are preferably provided as a single silicon nitride.

The combination of source materials, optionally, contains a flux. The flux used, if any, is not particularly limited. Preferred fluxes include halide containing materials, for example, LiCl, LiF, NaCl, NaF, KCl, KF, CsCl, CsF, $CaCl_2$, $CaF_2$, $BaCl_2$, $BaF_2$, $SrCl_2$, $SrF_2$, $AlCl_3$, $AlF_3$ and $NH_4Cl$.

TABLE 1

| Element | Raw Material Source |
| --- | --- |
| M(II) (e.g., Ca, Sr, Ba, Mg) | M(II) nitride, M(II) metal, M(II) silicide, M(II) alloy, M(II) carbide, M(II) azide, M(II) oxide, M(II) carbonate |
| M(III) (e.g., Al) | M(III) nitride, M(III) oxynitride, M(III) oxide, M(III) carbide, M(III) carbonitride, M(III) metal, M(III) halide |
| Silicon (Si) | silicon nitride, silicon oxynitride, Si, silicon carbide, silicide, silicon amide, silicon carbodiimide, silicon oxide |
| Nitrogen (N) | nitride, nitrogen gas, ammonia gas, amide, azide, nitrogen containing organic precursor |
| Carbon (C) | carbide, carbon carbidonitride, silicon carbide, organic compound, $Si(NCN)_2$, $C_2N_2H_4$, $C_2N_2(NH)$, $C_3N_3(NH_2)_3$, $CN_x$ |
| A | A nitride (e.g., EuN), A oxide (e.g., $Eu_2O_3$), A metal (e.g., Eu), a halogenated compound (e.g., $EuF_3$ and $CeF_3$) |

The selected combination of source materials is preferably mixed by a dry process, a wet process or a combination dry/wet process.

In a preferred dry mixing process, the selected combination of source materials is preferably milled and blended. For example, the selected combination of source materials can be milled and blended by hand using a mortar and pestle. The selected combination of source materials can be mixed and dry milled separately or together (using, for example, a ribbon blender, a V type blender or a high speed mixer, a hammer mill, a roll mill, a ball mill or a jet mill).

In a preferred wet mixing process, the selected combination of source materials is preferably added to a liquid (e.g., ethanol, acetone) and then pulverized and mixed using a wet mill. The wet milled source material is then extracted from the liquid by, for example, drying or spray drying.

In a preferred dry/wet process, the selected combination of source materials is preferably milled and blended by hand using a mortar and pestle. The selected combination of source materials can first be dry milled separately or together (using, for example, a hammer mill, a roll mill, a ball mill or a jet mill). The milled source materials are then mixed with a liquid (e.g., ethanol, acetone) to facilitate mixing. The mixed source material is then extracted from the liquid to facilitate further processing by, for example, drying or spray drying.

The mixture of source materials is then fired. Typically, the mixture of source materials are placed in a high temperature crucible preferably made of a material less reactive than the mixture of source materials under the processing conditions. The temperature to which the mixture of source materials is exposed during firing is preferably 1600 to 2000° C. The mixture of source materials is preferably maintained at a pressure at or above atmospheric pressure during the firing process.

The mixture of source materials is preferably maintained under a high purity gas atmosphere throughout the firing process. The atmosphere present during the firing process is not particularly limited; however, a reducing atmosphere is preferred. Preferably, the atmosphere present during the firing process is selected from the group consisting of nitrogen, argon, carbon monoxide, hydrogen and mixtures thereof. Most preferably, the atmosphere present during the firing process is a high purity nitrogen or mixture of nitrogen and hydrogen.

The firing time can vary depending on the firing temperature and the firing pressure. Preferably, the firing time is 10 minutes to 24 hours (more preferably 4 to 16 hours; most preferably 8 to 12 hours).

Optionally, the fired material can be milled, sieved and refired. This process of milling, sieving and refiring can optional be repeated multiple times.

Post firing, the fired material is preferably ground, sieved, washed and dried, as necessary. Preferably, the fired material is washed with acid followed by washing with deionized water. Preferably, the fired material is ground, sieved to remove undesired fines and aggregates, and then dispersed in an aqueous acid solution (preferably a dilute acid having an acid concentration of 0.5 to 4 mol/L). The aqueous acid solution used is preferably selected from the group consisting of hydrochloric acid, hydrofluoric acid, sulfuric acid and nitric acid. Most preferably, the aqueous acid solution used is hydrochloric acid. The material is then preferably further washed with deionized water. The washing with acid preferably removes raw material components that are not incorporated into the crystal structure of the inorganic compound represented by formula (1), unwanted by products and flux components (e.g., halides and alkali Earths) from the phosphor composition. The washed material is then preferably dried. The dried material is then preferably sieved to remove any fines and oversize material.

The dried material can, optionally, be further treated to provide a phosphor composition of the present invention having a surface treatment.

The dried material can, optionally, be dispersed in a liquid carrier to form a phosphor composition of the present invention.

The lighting apparatus of the present invention for emitting white light, comprises: at least one light source, wherein the light source produces light having a source luminescence spectrum; and, a first source luminescence spectrum modifier, wherein the first source luminescence spectrum modifier is a red phosphor of the present invention; and, wherein the red phosphor is radiationally coupled to the light source. The lighting apparatus of the present invention can contain a plurality of light sources.

The light source(s) used in the lighting apparatus of the present invention preferably include light sources that emit light having a peak wavelength, $P\lambda_{source}$, between 200 and 600 nm (preferably, between 200 and 550 nm; more preferably, between 350 and 490 nm). Preferably, the light source used in the lighting apparatus of the present invention is a semiconductor light source. More preferably, the light source used in the lighting apparatus of the present invention is a semiconductor light source selected from GaN based light sources; InGaN based light sources (e.g., $In_iAl_jGa_kN$, where $0 \leq i \leq 1$, $0 \leq j \leq 1$, $0 \leq k \leq 1$, and where $i+j+k=1$); BN based light sources; SiC based light sources; ZnSe based light sources; $B_iAl_jGa_kN$ based light sources, where $0 \leq i \leq 1$, $0 \leq j \leq 1$, $0 \leq k \leq 1$, and where $i+j+k=1$; and, $B_iIn_jAl_kGa_mN$ based light sources, where $0 \leq i \leq 1$, $0 \leq j \leq 1$, $0 \leq k \leq 1$, $0 \leq m \leq 1$, and where $i+j+k+m=1$. Most preferably, the light source used in the lighting apparatus of the present invention is selected from a GaN based light source and an InGaN based light source; wherein the light source emits light having a peak wavelength, $P\lambda_{source}$, between 200 and 600 nm (preferably, between 200 and 550 nm; more preferably, between 350 and 490 nm; most preferably, wherein $P\lambda_{source}$ is 453 nm).

Preferably, the lighting apparatus of the present invention contains a light source having a luminescence spectrum with a peak wavelength, $P\lambda_{source}$, between 200 and 600 nm; wherein the red phosphor exhibits an emission spectrum having a peak wavelength, $P\lambda_{phosphor}$, between 600 and 660 nm upon exposure to the light produced by the light source.

The lighting apparatus of the present invention, optionally, further comprises: a second source luminescence spectrum modifier, wherein the second source luminescence spectrum modifier comprises at least one additional phosphor, wherein the at least one additional phosphor is radiationally coupled to at least one of the light source and the first source luminescence spectrum modifier. Preferably, the second source luminescence spectrum modifier is at least one additional phosphor selected from the group consisting of red emitting phosphors, blue emitting phosphors, yellow emitting phosphors, green emitting phosphors and combinations thereof. Preferably, the second source luminescence spectrum modifier is at least one additional phosphor interposed between the light source and the first luminescence spectrum modifier.

Preferably, the lighting apparatus of the present invention comprises at least two phosphors, wherein at least one of the phosphors is a red phosphor of the present invention. The at least two phosphors can be intermixed in one matrix. Alternatively, the at least two phosphors can be dispersed separately such that the phosphors can be superimposed in layers instead of dispersing the phosphors together in a single matrix. The layering of the phosphors can be used to obtain a final light emission color by way of a plurality of color conversion processes.

Some embodiments of the present invention will now be described in detail in the following Examples.

Comparative Example C1 and Examples 1-6

Preparation of Inorganic Compounds of Formula (1)

The inorganic compound represented by formula (1) in each of Comparative Example C1 and Examples 1-6 was prepared by a solid state reaction with the starting materials in the amounts identified in TABLE 2. The Metal nitrides used in the Examples were prepared from the respective metal in advance using standard nitridation techniques. In each of the Examples, the starting materials noted in TABLE 2 were provided in powder form, were weighed out, physically mixed together and ground with a mortar and pestle in a glove box under a dried nitrogen atmosphere to form a uniform powder mixture. The powder mixture was then loaded in a firing crucible and placed in a high temperature furnace under a high purity nitrogen/hydrogen atmosphere. The powder mixture was then heated at a temperature of 1550 to 2000° C. for 6 to 12 hours. The resulting powder was removed from the firing crucible, ground using a mortar and pestle and sieved using 60 mesh sieve to provide the product inorganic compound.

TABLE 2

| Ex # | $Ca_3N_2$ (g) | $Sr_2N$ (g) | AlN (g) | $Si_3N_4$ (g) | SiC (g) | $Eu_2O_3$ (g) |
|---|---|---|---|---|---|---|
| C1 | 1.774 | — | 1.484 | 1.693 | — | 0.051 |
| 1 | 1.792 | — | 1.498 | 1.367 | 0.293 | 0.051 |
| 2 | 1.809 | — | 1.513 | 1.035 | 0.592 | 0.052 |
| 3 | 1.827 | — | 1.528 | 0.697 | 0.897 | 0.052 |
| 4 | 1.846 | — | 1.543 | 0.352 | 1.208 | 0.053 |
| 5 | 1.864 | — | 1.559 | — | 1.525 | 0.054 |
| 6 | 0.281 | 2.161 | 1.176 | 1.073 | 0.230 | 0.025 |

Inorganic Compound Properties

The emission spectrum exhibited by each of the product inorganic compounds upon excitation with a light source (i.e., a light emitting diode (LED) lamp peaking at 453 mm and its emission was analyzed using an Ocean Optics USB4000 spectrometer available from Ocean Optics). The peak wavelength, $P\lambda_{phosphor}$, and the full width half maximum of the emission peak, FWHM, determined from the emission spectra for each inorganic compound are reported in TABLE 3.

The color coordinates $CIE_x$ and $CIE_y$ in the XYZ color system specified in CIE 13.3-1995 were calculated for each of the inorganic compounds from the emission spectrum in the 380-780 nm wavelength range when excited by the emission from the LED light source according to the method described in CIE 13.3-1995. The color coordinates determined for the inorganic compounds are reported in TABLE 3.

Figure 1:
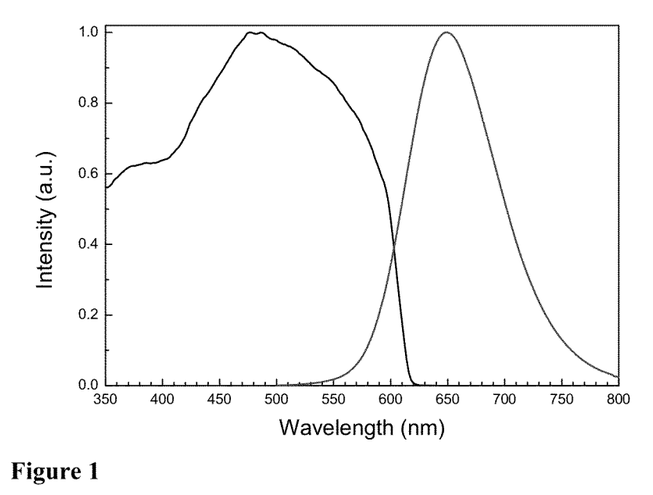
FIG. 1 is a graph depicting the excitation and resulting emission spectra for a red phosphor of the present invention.
Figure 2:
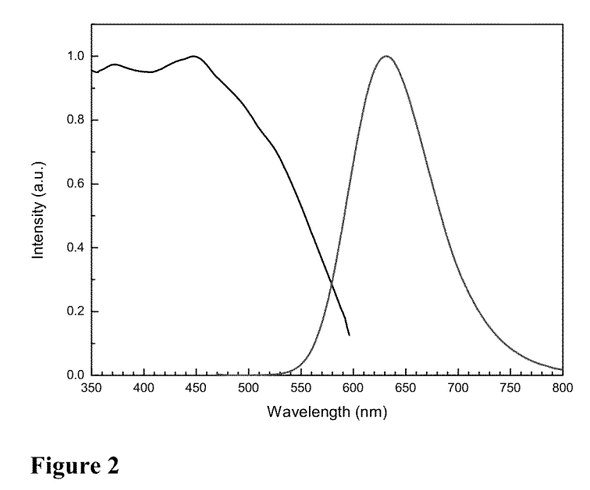
FIG. 2 is a graph depicting the excitation and resulting emission spectra for a red phosphor of the present invention.
Figure 3:
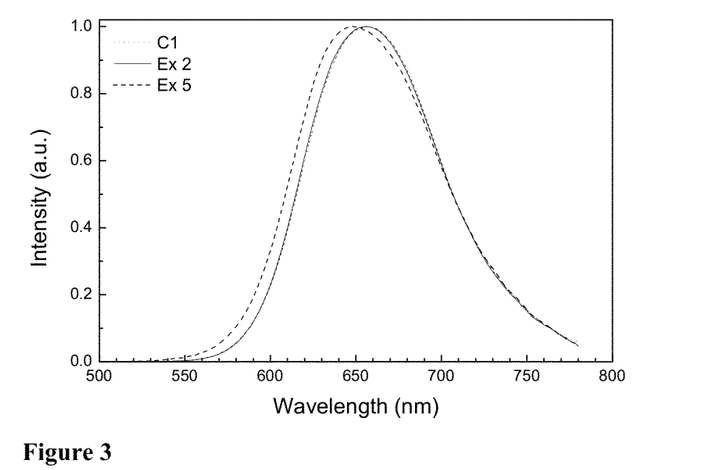
FIG. 3 is a graph depicting the emission spectra for several red phosphors of the present invention.
Figure 4:
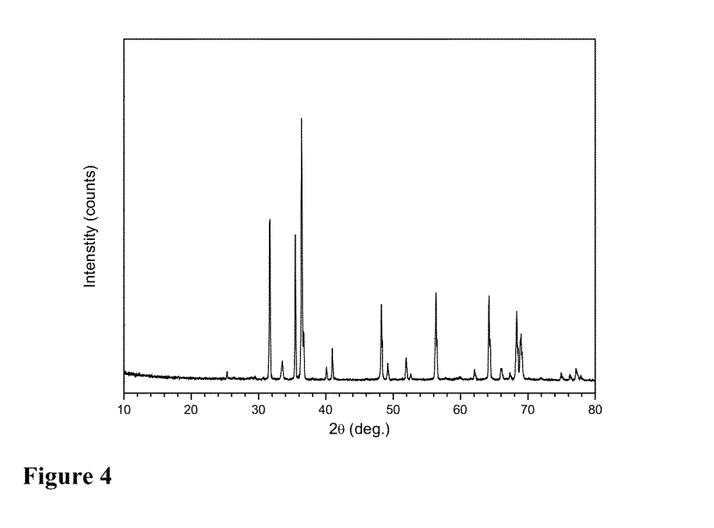
FIG. 4 is a graph depicting the x-ray diffraction pattern for a red phosphor of the present invention.
Figure 5:
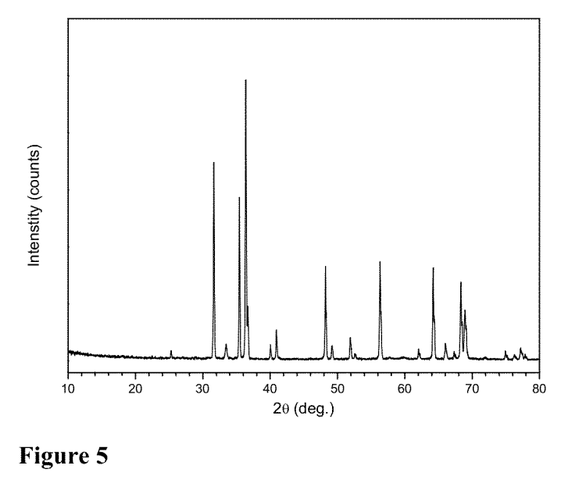
FIG. 5 is a graph depicting the x-ray diffraction pattern for a red phosphor of the present invention.
Figure 6:
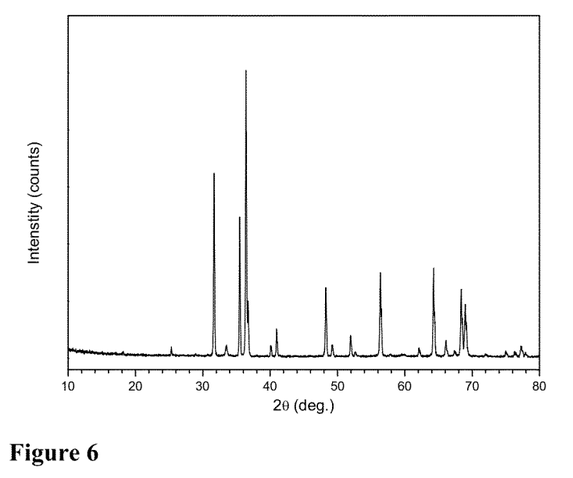
FIG. 6 is a graph depicting the x-ray diffraction pattern for a red phosphor of the present invention.
Figure 7:
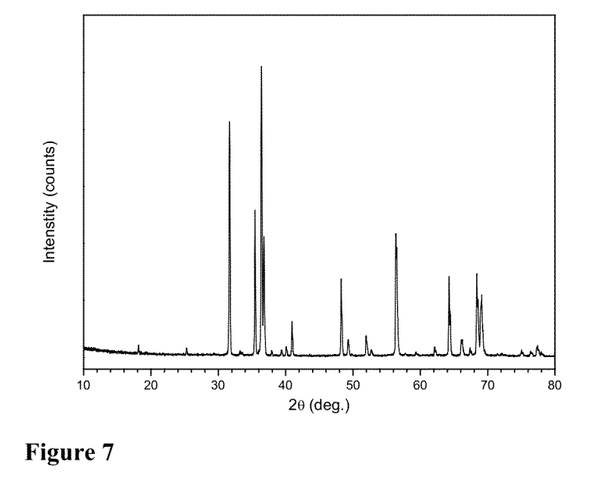
FIG. 7 is a graph depicting the x-ray diffraction pattern for a red phosphor of the present invention.

The quantum efficiency for each of the product inorganic compounds from the Examples was determined by taking a sample of the inorganic compound packed into a cell, mounting the cell in an integrating sphere and then exposing the inorganic compound to light emitted from a light source. Specifically, the light from the light source was guided through an optical tube, filtered through a narrow band pass filter to provide monochromatic light with a wavelength of 453 nm that was then directed at the inorganic compound. The spectrum of light emitted from the inorganic compound in the integrating sphere upon excitation with the light from the light source and the light reflected by the inorganic compound were measured with an Ocean Optics USB 4000 spectrometer available from Ocean Optics. The luminous efficiency was measured by packaging in an LED based on a maximum possible efficacy of 683 lm/W. The emission percent was measured by the integrated emission spectral area/excitation spectral area. Each of these values is reported in TABLE 3. The excitation and emission spectra for the inorganic compound prepared according to Example 5 are depicted in FIG. 1. The excitation and emission spectra for the inorganic compound prepared according to Example 6 are depicted in FIG. 2. The emission spectra for inorganic compounds prepared according to Comparative Example C1 and Examples 2 and 5 are depicted in superimposed fashion in FIG. 3.

TABLE 3

| Ex # | CIE x | CIE y | FWHM (nm) | P$\lambda_{phosphor}$ (nm) | lm/W | QE (%) | Emission (%) |
|---|---|---|---|---|---|---|---|
| C1 | 0.679 | 0.320 | 91 | 657 | 85.4 | 89.4 | 88.5 |
| 1 | 0.675 | 0.325 | 94 | 653 | 88.0 | 90.6 | 94.5 |
| 2 | 0.680 | 0.320 | 92 | 656 | 85.6 | 89.3 | 94.1 |
| 3 | 0.678 | 0.322 | 93 | 655 | 85.2 | 88.4 | 94.5 |
| 4 | 0.675 | 0.325 | 95 | 653 | 88.1 | 90.6 | 96.5 |
| 5 | 0.666 | 0.334 | 98 | 648 | 77.9 | 77.8 | 82.3 |
| 6 | 0.640 | 0.359 | 92 | 632 | 110 | 74.4 | 82.1 |

Figure 8:
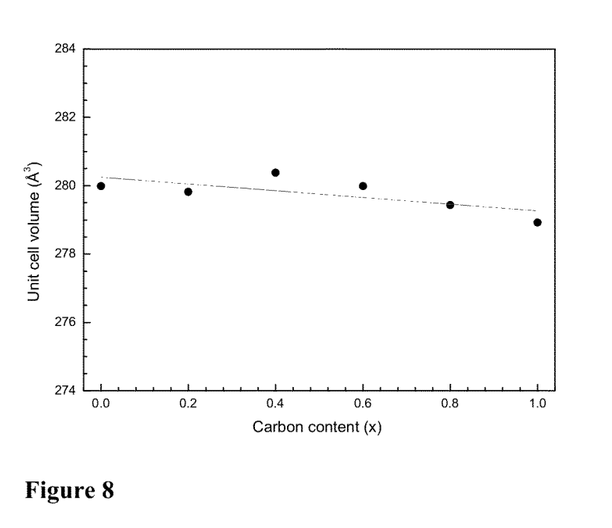
FIG. 8 is a graph depicting the unit cell volume as a function of carbon content.

Inorganic compounds prepared according to Comparative Example C1 and Examples 1-6 were analyzed by x-ray powder diffraction (2-theta scan) using a Rigaku RINT2000 X-ray powder diffractometer using Ni-filtered CuKα radiation (λ=1.54059 Å) at 45 kV/40 mA. The sample was scanned (2-theta scan) from 10 to 80° with a step size of 0.02 and a counting time 1 second per step. The samples were rotated at 20 RPM. The XRD patterns for Comparative Example C1 and Examples 2, 4 and 5 are provided in FIGS. 4-7, respectively. The unit cell volume (in Å$^3$) of the lattice of the inorganic compounds decreases slightly with increasing carbon content as shown in FIG. 8.

Figure 9:
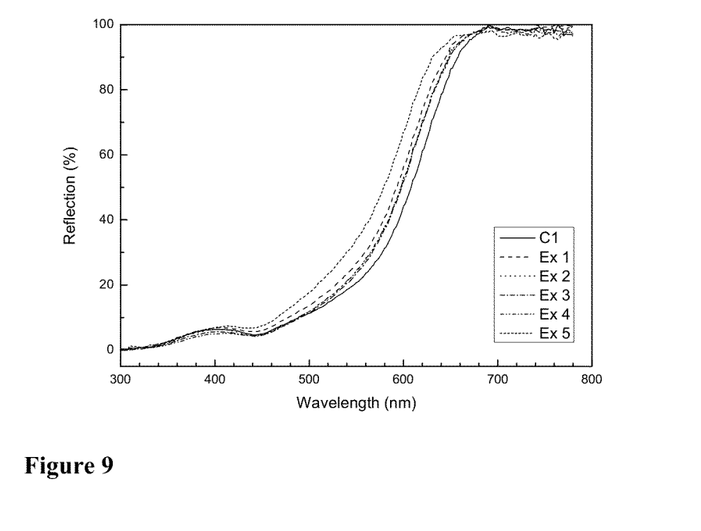
FIG. 9 is a graph depicting the reflectance spectra for several red phosphors of the present invention.
Figure 10:
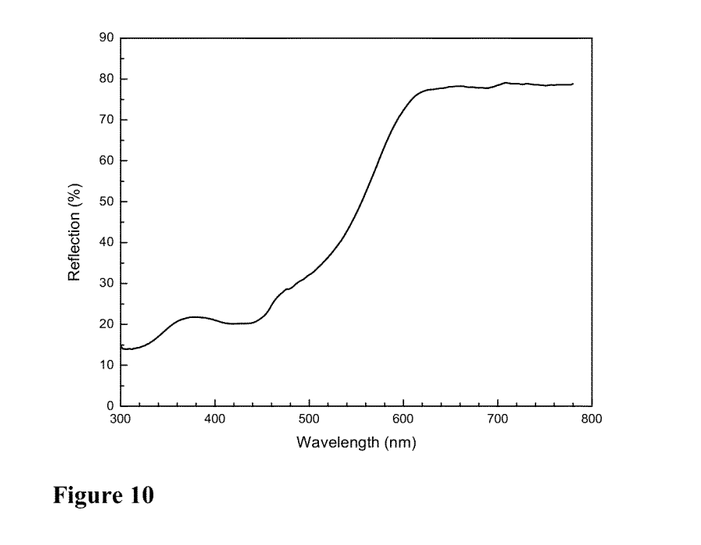
FIG. 10 is a graph depicting the reflectance spectrum for a red phosphor of the present invention.

The reflectance spectra exhibited by each of the product inorganic compounds upon excitation with an Xenon lamp peaking at 467 nm and its emission spectra was observed using a SPEX Fluorlog 2 spectrometer available from Jobin Yvon. The observed reflectance spectra for Comparative Example C1 and Examples 1-5 are depicted in FIG. 9 and for Example 6 is depicted in FIG. 10.

Figure 11:
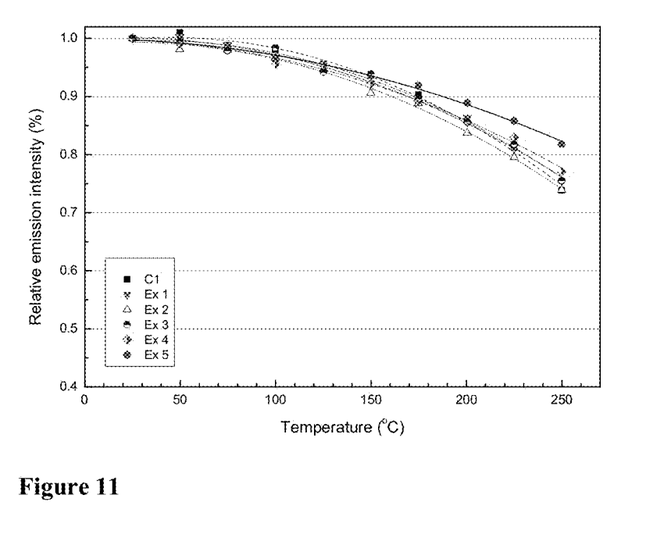
FIG. 11 is a graph depicting thermal quenching behavior exhibited by several red phosphors of the present invention.
Figure 12:
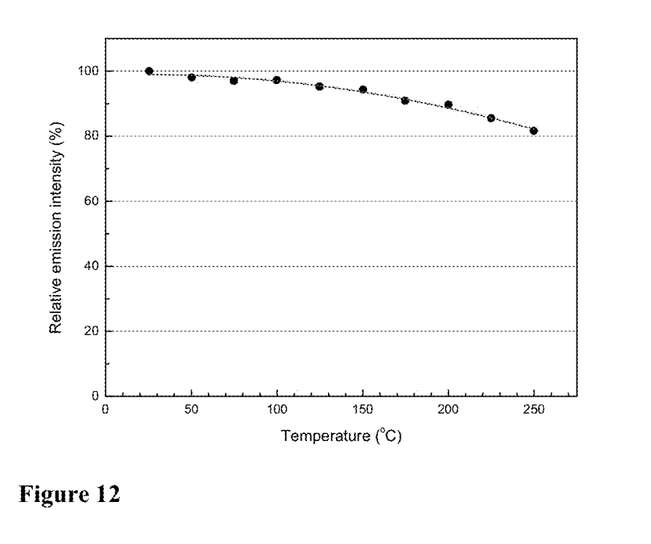
FIG. 12 is a graph depicting thermal quenching behavior exhibited by a red phosphor of the present invention.

The thermal quenching properties of inorganic compounds prepared according to Comparative Example C1 and Examples 1-6 were evaluated using an Ocean Optics USB2000 and a custom made heater. The results of the thermal quenching analysis observed for Comparative Example C1 and Examples 1-5 are depicted in FIG. 11. The results of the thermal quenching analysis observed for Example 6 is depicted in FIG. 12.

We claim:
1. A red phosphor, comprising:
an inorganic compound represented by formula (2)

$$(Ca_aSr_b)AlSiN_uC_xO_w:zA \quad (2)$$

wherein A is at least one luminescence activator; wherein $0 \leq a \leq 1$; wherein $0 \leq b \leq 1$; wherein $(a+b) \leq 1$; wherein $u=\{3-(4x/3)-(2w/3)\}$; wherein $w=(3z/2)$; $0<x \leq 2$; wherein $0<(x+w)<3$; wherein $x \neq w$; and, wherein $0<z \leq 0.5$.

2. The red phosphor of claim 1, wherein A is Eu$^{2+}$.
3. The red phosphor of claim 2, wherein $0.001<z \leq 0.01$.
4. The red phosphor of claim 3, wherein $0.2 \leq x \leq 1$.
5. The red phosphor of claim 3, wherein $0.7 \leq b \leq 0.9$.
6. The red phosphor of claim 1, wherein the red phosphor exhibits an emission spectra having a peak wavelength, P$\lambda_{phosphor}$, between 600 nm and 660 nm upon excitation from a light source exhibiting an emission spectra having a peak wavelength, P$\lambda_{source}$, between 200 nm and 600 nm.
7. The red phosphor of claim 1, further comprising a surface treatment; wherein the surface treatment is applied to a surface of the inorganic compound.
8. A phosphor composition, comprising: a red phosphor according to claim 1; and, a liquid carrier; wherein the red phosphor is dispersed in the liquid carrier.
9. A lighting apparatus for emitting white light comprising:
a light source, wherein the light source produces light having a source luminescence spectrum; and,
a first source luminescence spectrum modifier, wherein the first source luminescence spectrum modifier is a red phosphor according to claim 1;
wherein the red phosphor is radiationally coupled to the light source.
10. The lighting apparatus of claim 9, wherein the source luminescence spectrum has a peak wavelength, P$\lambda_{source}$, between 200 and 600 nm; and, wherein, upon excitation of the red phosphor by exposure to the light produced by the light source, the red phosphor exhibits an emission spectrum having a peak wavelength, P$\lambda_{phosphor}$, between 600 and 660 nm.

* * * * *